US010206317B2

(12) United States Patent
Liukkonen

(10) Patent No.: US 10,206,317 B2
(45) Date of Patent: Feb. 12, 2019

(54) MODULAR RADIO FREQUENCY SHIELDING

(71) Applicant: Microsoft Technology Licensing, LLC, Redmond, WA (US)

(72) Inventor: Timo Liukkonen, Muurla (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 170 days.

(21) Appl. No.: 14/753,246

(22) Filed: Jun. 29, 2015

(65) Prior Publication Data

US 2016/0381842 A1    Dec. 29, 2016

(51) Int. Cl.
| H05K 9/00 | (2006.01) |
| H05K 1/02 | (2006.01) |
| H05K 1/18 | (2006.01) |
| H05K 3/30 | (2006.01) |

(52) U.S. Cl.
CPC ......... *H05K 9/0024* (2013.01); *H05K 1/0216* (2013.01); *H05K 1/181* (2013.01); *H05K 3/30* (2013.01); *H05K 9/0026* (2013.01); *H05K 9/0032* (2013.01); *H05K 2201/10098* (2013.01)

(58) Field of Classification Search
CPC .......................... H05K 9/0032; H05K 9/0026
See application file for complete search history.

(56) References Cited

U.S. PATENT DOCUMENTS

| 4,700,275 A | 10/1987 | Wood |
| 5,414,597 A | 5/1995 | Lindland et al. |
| 6,175,077 B1 | 1/2001 | Mendolia et al. |
| 6,192,577 B1 * | 2/2001 | Larsson ............... H05K 1/0218 174/351 |
| 6,614,405 B1 | 9/2003 | Mikkonen et al. |
| (Continued) | | |

FOREIGN PATENT DOCUMENTS

| EP | 2814311 A2 | 12/2014 |
| EP | 2825012 A2 | 1/2015 |
| (Continued) | | |

OTHER PUBLICATIONS

"PCB Shielding", Published on: Sep. 9, 2007 Available at: http://www.shieldedcomponents.co.nz/PCB-Shielding.html.

(Continued)

*Primary Examiner* — Hung V Ngo

(57) ABSTRACT

In an embodiment, a modular RF shielding is disclosed. According to an embodiment, a device is disclosed comprising: at least one radio frequency shielding block including: an electrically conductive wall configured to radio frequency shielding; an electrically conductive portion of a ceiling, wherein the portion of the ceiling is connected to the wall; at least one support element, or the shape of the modular block itself, is extending transversely from the wall and configured to uphold the wall, wherein the support element is configured to rest against a portion of a printed circuit board and a length of the support element is shorter than a length of the block; wherein the wall is configured next to an electrical component of the printed circuit board and wherein the electrical component is configured at least partly beneath the portion of the ceiling. Other embodiments relate to a mobile device and a manufacturing method for the modular RF shielding.

20 Claims, 9 Drawing Sheets

(56) References Cited

U.S. PATENT DOCUMENTS

| | | | |
|---|---|---|---|
| 6,850,196 B2 | 2/2005 | Wong et al. | |
| 6,881,896 B2 * | 4/2005 | Ebihara | H01L 23/552 |
| | | | 174/546 |
| 7,087,835 B2 | 8/2006 | Ziberna | |
| 7,113,410 B2 | 9/2006 | Pawlenko et al. | |
| 7,277,301 B2 * | 10/2007 | Liang | H05K 9/0028 |
| | | | 174/350 |
| 7,501,587 B2 * | 3/2009 | English | H05K 9/0032 |
| | | | 174/354 |
| 7,663,895 B2 | 2/2010 | Huang | |
| 8,438,893 B2 | 5/2013 | Durney et al. | |
| 8,472,203 B2 | 6/2013 | Dabov et al. | |
| 8,700,108 B2 | 4/2014 | Patil et al. | |
| 2005/0219832 A1 | 10/2005 | Pawlenko et al. | |
| 2011/0255850 A1 | 10/2011 | Dinh et al. | |
| 2012/0044663 A1 | 2/2012 | Lu et al. | |
| 2012/0218727 A1 | 8/2012 | Kim | |
| 2013/0322040 A1 | 12/2013 | Watanabe | |

FOREIGN PATENT DOCUMENTS

| | | |
|---|---|---|
| GB | 2208970 A | 4/1989 |
| KR | 100293940 B1 | 4/2001 |

OTHER PUBLICATIONS

"Shielding with Connector", Feb. 19, 2015 Available at: http://www.weiku.com/products-image/20013624/Shielding-with-connector.html.

"International Search Report and Written Opinion Issued in PCT Application No. PCT/US2016/037724", dated Oct. 4, 2016, 15 Pages.

"Second Written Opinion Issued in PCT Application No. PCT/US2016/037724", dated May 30, 2017, 7 Pages.

"International Preliminary Report on Patentability Issued in PCT Application No. PCT/US2016/037724", dated Oct. 5, 2017, 9 Pages.

* cited by examiner

MODULAR RADIO FREQUENCY SHIELDING

BACKGROUND

Electromagnetic shielding comprises the practice of reducing the electromagnetic field in a space by blocking the field with barriers made of conductive or magnetic materials. Shielding is typically applied to enclosures to isolate electrical devices from the outside world, and to cables to isolate wires from the environment through which a cable runs. Electromagnetic shielding that blocks radio frequency electromagnetic radiation is also known as RF shielding. The shielding can reduce the coupling of radio waves, electromagnetic fields and electrostatic fields. A conductive enclosure used to block electrostatic fields is also known as a Faraday cage. The amount of reduction depends upon the material used, its thickness, the size of the shielded volume and the frequency of the fields of interest and the size, shape and orientation of apertures in the shield to an incident electromagnetic field.

Radio frequency shielding has been traditionally performed using metal structures such as cans. The structure is usually either one piece so that the walls and the top part of the structure such as a roof are made of the same metal sheet, or a two piece system, where walls, establish a frame of the structure, and one piece as the top part which can be disconnected from the structure, for example a common soup can structure.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

In an embodiment, a modular RF shielding is disclosed. According to an embodiment, a device is disclosed comprising: at least one radio frequency shielding block including: an electrically conductive wall configured to radio frequency shielding; an electrically conductive portion of a ceiling, wherein the portion of the ceiling is connected to the wall; at least one support element extending transversely from the wall and configured to uphold the wall, wherein the support element is configured to rest against a portion of a printed circuit board and a length of the support element is shorter than a length of the block; wherein the wall is configured next to an electrical component of the printed circuit board and wherein the electrical component is configured at least partly beneath the portion of the ceiling.

Other embodiments relate to a mobile device and a manufacturing method for the modular RF shielding.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the present embodiments and is not intended to represent the only forms in which the present embodiment may be constructed or utilized. However, the same or equivalent functions and sequences may be accomplished by different embodiments.

Although the present embodiments may be described and illustrated herein as being implemented in a smartphone or a mobile phone, these are only examples of a device configured for radio frequency shielding and not a limitation. As those skilled in the art will appreciate, the present embodiments are suitable for application in a variety of different types of devices, for example, in tablets, phablets, computers, cameras, game consoles, small laptop computers, wearable devices, general electronic and computing devices etc.

Figure 1:
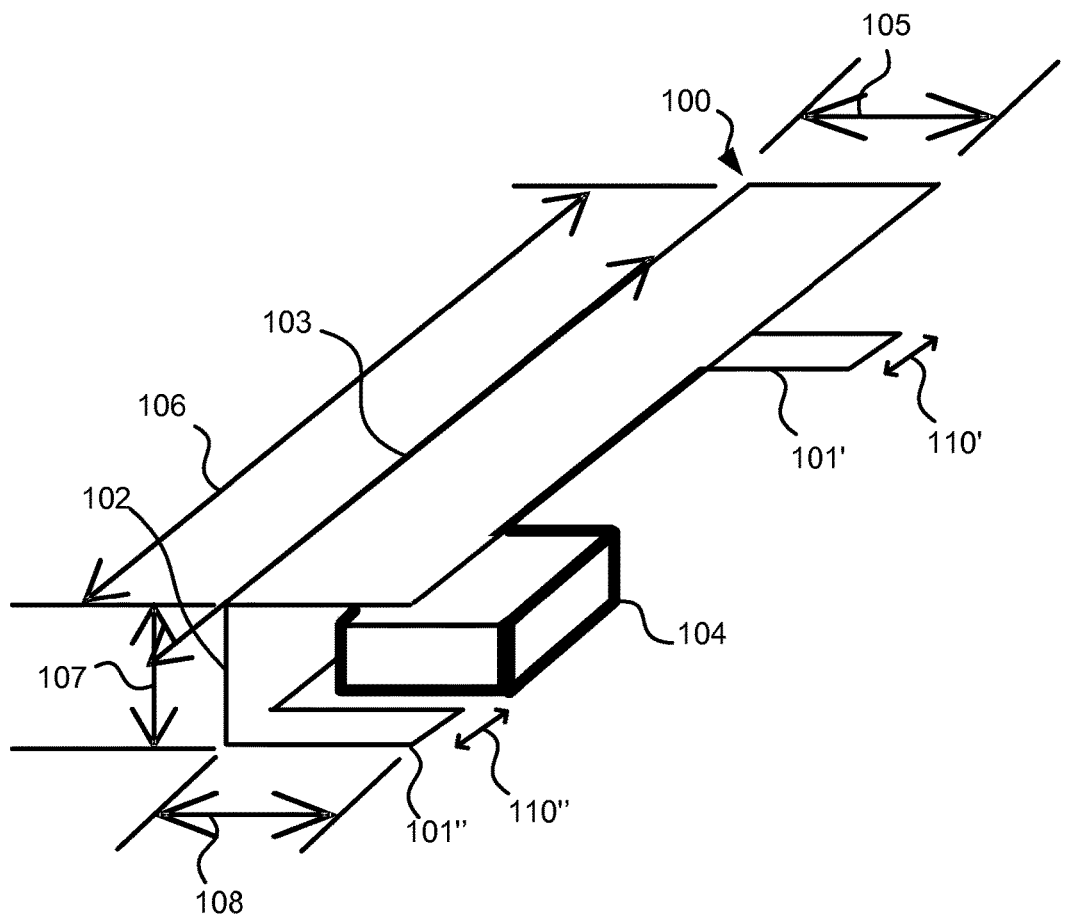
FIG. 1 illustrates a schematic representation of a modular shielding block having an electrical component positioned next to it according to an embodiment.

An embodiment of a modular shielding block 100 is illustrated in FIG. 1. The embodiment includes two support elements 101, such as supporting legs 101',101", which are located at both ends of the block 100. According to an embodiment, the support elements 101 may be referred to as toes. According to an embodiment, the number of support elements may vary from 1-n depending on the construction of the block 100 or the completed frame made of blocks 100 or both and/or the size of the electrical components placed next to block 100.

In an embodiment, as illustrated in FIG. 1, a modular shielding block 100 includes two supporting legs 101', 101". The supporting legs 101',101" may be positioned at both ends of the modular shielding block 100. The legs 101',101" may be positioned substantially at the ends of the block 100, wherein they are not positioned right at the ends, but slightly towards the center of the block 100 from the ends respectively. The supporting legs 101',101" may be transversal projections projecting from a wall 102 of the block 100. The supporting legs 101',101" may be horizontal supporting elements for the block 100. The legs 101',101" may be positioned in a parallel direction with respect to a printed circuit board, PCB, surface. Alternatively, they may have a slightly transversal positioning. For example, only a part of the leg 101 may be in contact with the PCB surface, for example only the end of the leg 101 is in contact with the PCB surface. The wall 102 is vertically erected from the PCB surface. According to an embodiment the wall 102 may be substantially vertically erected from the surface, or the wall 102 may be slanted. According to an embodiment, the bottom of the wall 102, which is positioned against the PCB surface, may be toothed, uneven, or flat. A ceiling 103 extends from the wall 102. The ceiling 103, or in some embodiments a canopy or a visor, is projecting laterally, for example horizontally, from the wall 102. It may be in a parallel direction with respect to the leg 101',101". According to an embodiment, a component 104 of electronics of a device may be wholly or partly positioned beneath the ceiling 103. The component 104 may, for example, be a resistor, a capacitor or an integrated circuit, a signal line, a wire, a bus etc. The component 104 may be placed right next to the wall 102. The component 104 may be placed in contact with the wall 102, or in contact with the ceiling 103 or in contact with both the wall and the ceiling. There may be several different kinds of a plurality of components 104 that are positioned accordingly, a single component 104 is shown in FIG. 1 merely for the purpose of illustration. There may be a gap between the component 104 and the wall 102, and also a gap between the ceiling 103 and the component 104. According to an embodiment, a length 106 of the block 100 may typically be 10-20 mm. A length 110 of the supporting leg 101 may be 1 mm. In FIG. 1, the lengths 110' and 110" are illustrated, and they may have the same value or have different values, for example length 110' is 1 mm and length 110" is 2 mm. The length 110 of the supporting leg 101 may be shorter than the length 106 of the block 100. A total length of supporting legs 101', 101" may be shorter than the length 106 of the block 100. A width 105 of the ceiling 103 may be 1 mm. A height 107 of the block 100, i.e. of the wall, may be 1 mm. A width 108 of the supporting leg 101 may be 1 mm. According to an embodiment, the component 104 may be as small as 0.4 mm*0.2 mm, or even smaller, as the miniaturization trend in electronics industry produces ever smaller components on the market. It should be noted that these examples are merely one embodiment of physical measures which may vary depending of the intention and design of the RF shielding as well as continuous size miniaturization trend of PCB and electrical components.

Referring to FIG. 1, according to an embodiment the supporting legs 101',101" may be configured to uphold the block 100. The block 100 may be, consequently, upheld before it is attached to the PCB. For example, before a process for establishing the final RF shield from the blocks, the supporting leg may uphold the block 100 in a desired position. Because the supporting legs', 101',101" are situated only with respect to a small portion of the length 106 of the block 100, there is a space for accommodating a component 104 or many components. The modular shielding block 100 may be a part of a shielding frame for an electromagnetic shielding that blocks radio frequency electromagnetic radiation, which may be referred to as RF shielding. Individual blocks 100 can be used to make a larger shielding frame in a modular fashion.

Figure 3:
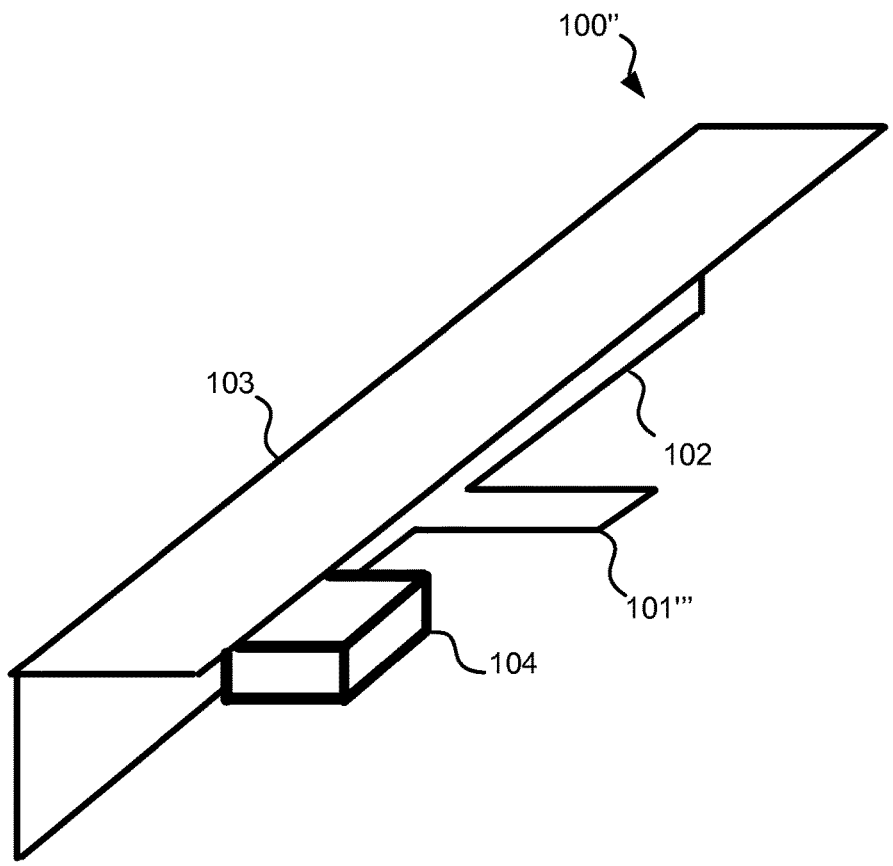
FIG. 3 illustrates a schematic representation of a modular shielding block having a single supporting element and an electrical component positioned next to the block according to an embodiment.

An embodiment may save most of the space occupied by known modular building blocks. This saved area can be used, for example, for components such as resistors and capacitors as illustrated in FIG. 1. According to an embodiment, physical space in x and y directions on the PCB surface, onto which the blocks 100 are to be attached at a bottom of the block 100, may be saved because of more compact structures. Space may be saved for electrical components 104 such as resistors, capacitors or integrated circuits. According to an embodiment, the electrical components 104 may be placed right next to inner walls 102 of the shielding blocks 100, because the shape that holds the blocks 100 in a correct place and position before attachment is maintained, for example, in an embodiment using one leg substantially in the middle of the block 100 as illustrated in FIG. 3, or two legs at the ends of the blocks 100 as illustrated in FIG. 1. The supporting leg 101 prevents each individual block 100 from falling or overbalancing. Blocks 100 may be used as modular pieces for establishing a shielding frame and save space for the components 104 within the frame.

Figure 2:
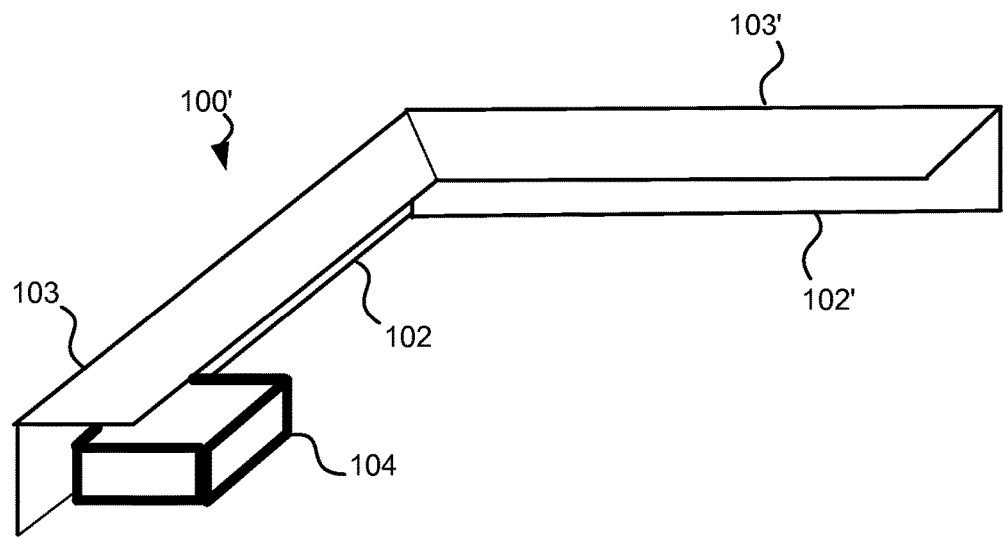
FIG. 2 illustrates a schematic representation of a modular corner shielding block having an electrical component positioned next to it according to an embodiment.

An embodiment of a modular corner shielding block 100' is illustrated in FIG. 2. A bottom of a wall 102' may be configured to act as the supporting leg for the block 100'.

An embodiment, as illustrated in FIG. 2 shows a corner version, i.e. modular block 100'. The wall 102 and the ceiling 103 are connected to another wall 102' and another ceiling 103' by a transversal corner joint. The corner may be at an angle of 90 degrees. Other kinds of corners with different angels may be used instead, and the corner does not need to be exactly at an angle of 90 degrees. The corner block 100' does not need any specific supporting leg 101 as for example illustrated in FIG. 1, because the bottom of the wall 102' is configured to act as the supporting leg for the block 100'. The walls 102,102' are vertically erected from the surface. The ceilings 103,103' extend from the respective walls 102,102'. The ceilings 103,103', or in some embodiments canopies or visors, are projecting laterally, for example horizontally, from the respective walls 102,102'. They may be in a parallel direction with respect to the PCB surface. According to an embodiment, a component 104 of electronics of a device may be wholly or partly positioned beneath any of the ceilings 103,103'. The component 104 may, for example, be a resistor, a capacitor or an integrated circuit, a signal line, a wire, a bus etc. The component 104 may be placed right next to any of the walls 102,102'. The component 104 may be placed in contact with any of the walls 102,102', or in contact with any of the ceilings 103,103' or in contact with any of the ceilings 103, 103' and any of the walls 102, 102' simultaneously. There may be several different kinds of a plurality of components 104 that are positioned accordingly, a single component 104 is shown in FIG. 2 merely for the purpose of illustration. There may be a gap between the component 104 and any of the walls 102,102', and also a gap between any of the ceilings 103,103' and the component 104. According to embodiments of a corner block 100', the length of the wall 102' and the ceiling 103' may be equal, shorter or longer to the length of the wall 102 and the ceiling 103. The shape itself of the corner block 100' is configured to act as the supporting element and supports the corner block 100' from falling or being overbalanced.

According to an embodiment, the modular corner shielding block 100' may be used in corners of a modular shielding frame. Referring to FIG. 2, according to an embodiment the wall 102' is configured to uphold the block 100'. The block 100' may be, consequently, upheld before it is attached to the PCB. For example, before a process for establishing the final RF shield from the blocks, the wall 102' may uphold the block 100' in a desired position. The supporting legs 101 may not be needed because the L-shaped block 100' stays in its place without a risk of falling or overbalancing. Because there are no additional supporting legs 101, there is more space to accommodate the components 104 next to the walls 102,102'. The modular shielding block 100' may be a part of a shielding frame for an electromagnetic shielding that blocks radio frequency electromagnetic radiation, which may be referred to as RF shielding. Individual blocks 100' can be used to make a larger shielding frame in a modular fashion together with or without blocks 100 of FIG. 1.

An embodiment of a modular shielding block 100" is illustrated in FIG. 3. A single supporting leg 101''' is configured to uphold the block 100".

Referring to an embodiment of FIG. 3, a modular shielding block 100" includes a supporting leg 101'''. The supporting leg 101''' may be positioned in the middle of the modular shielding block 100". The leg 101''' may be positioned substantially in the middle of the block 100", wherein the leg 101 is not positioned exactly at the center point, but rather in a different location between the ends of the block 100". The supporting leg 101''' may be a lateral projection projecting from a wall 102 of the block 100". The supporting leg 101''' may be a horizontal supporting element for the block 100". The leg 101''' may be positioned in a parallel direction with respect to the PCB surface. Alternatively, it may have a small or slight transversal positioning. The wall 102 is vertically or substantially vertically erected from the surface. According to an embodiment the wall 102 may be slanted. A ceiling 103 extends from the wall 102. The ceiling 103, or in some embodiments a canopy or a visor, is projecting laterally or horizontally from the wall 102. It may be in a parallel direction to the leg 101'''. According to an embodiment, a component 104 of electronics of a device may be wholly or partly positioned beneath the ceiling 103. The component 104 may, for example, be a resistor, a capacitor or an integrated circuit, a signal line, a wire, a bus, etc. The component 104 may be placed right next to the wall 102. The component 104 may be placed in contact with the wall 102, or in contact with the ceiling 103 or in contact with both the ceiling 103 and the wall 102. There may be several different kinds of a plurality of components 104 that are positioned accordingly, a single component 104 is shown in FIG. 3 merely for the purpose of illustration. There may be a gap between the component 104 and the wall 102, and also a gap between the ceiling 103 and the component 104.

Referring to FIG. 3, according to an embodiment the supporting leg 101" is configured to uphold the block 100". The block 100" may be, consequently, upheld before it is attached to the PCB. For example, before a process for establishing the final RF shield from the blocks, the supporting leg 101" may uphold the block in a desired position. Because the supporting leg 101' is situated only with respect to a small portion of the length of the block 100", there is a space for accommodating at least one or a plurality of components 104. The modular shielding block 100" may be a part of a shielding frame for an electromagnetic shielding that blocks radio frequency electromagnetic radiation, which may be referred to as RF shielding. Individual blocks 100" can be used to make a larger shielding frame in a modular fashion together with or without blocks 100 of FIG. 1 and/or 100' of FIG. 2.

An embodiment may save most of the space occupied by known modular building block shapes. This saved area can be used, for example, for components 104 such as resistors and capacitors as illustrated in FIG. 3. According to an embodiment, physical space may be saved on the PCB surface, for example in x and y directions onto which the blocks 100" are to be attached at a bottom of the block 100". Space may be saved for electrical components 104 such as resistors, capacitors or integrated circuits. According to an embodiment, the electrical components 104 may be placed right next to inner walls 102 of the shielding blocks 100", because the shape that holds the blocks 100" in a correct place and position before attachment is maintained, for example using one leg 101''' substantially in the middle of the block 100". The supporting leg 101''' prevents each individual block 100 from falling or overbalancing. Blocks 100" may be used as modular pieces for establishing the frame and save space for PCB components 104 within the frame.

Figure 4:
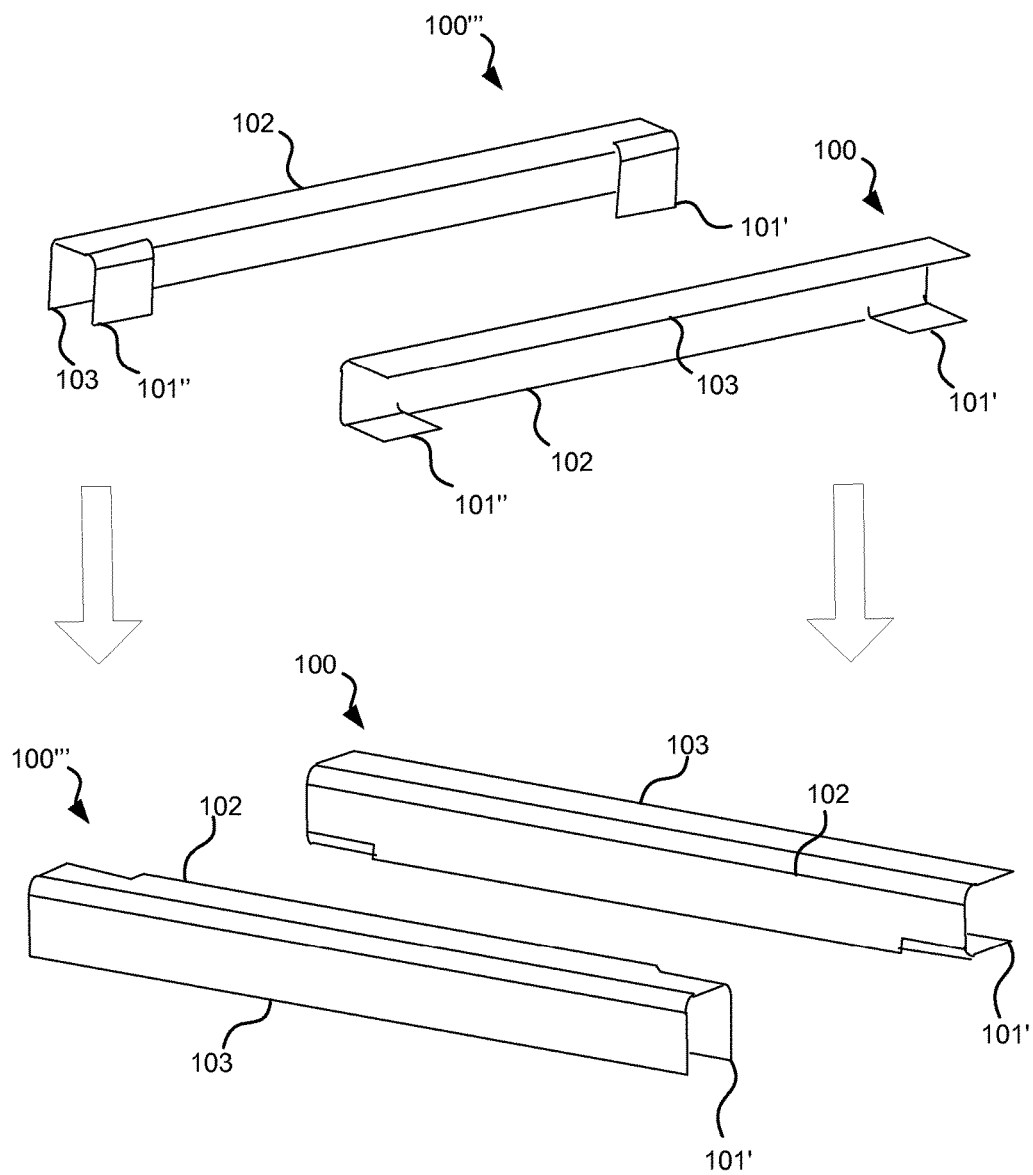
FIG. 4 illustrates a schematic representation of a modular shielding block having two supporting elements illustrated at different angles, in accordance with an embodiment.

FIG. 4 illustrates an embodiment wherein the block 100 of FIG. 1 has been turned to a different position on the PCB surface.

According to an embodiment, illustrated in FIG. 1, the bottom of the wall 102 of a block 100 rests against the PCB surface. The supporting leg 101 extends in a parallel direction with respect to the PCB surface. According to an embodiment as illustrated in FIG. 4, the end of the supporting legs 101', 101" or the end of the ceiling 103 or both the supporting legs 101, 101' and the ceiling 103 may be resting against the PCB surface. Consequently, the block 100 of FIG. 1 may be rotated 90 degrees in a clockwise direction. In the embodiment of FIG. 4, a component 104, shown in FIG. 1, FIG. 2 and FIG. 3, may be positioned even between the supporting leg 101 and the ceiling 103, which are resting against the PCB surface. For example, if the electronics include a thin and long component, such as a wire or a bus, it may be positioned next to the ceiling 103 of the block 100''' and configured between the supporting leg 101 and the ceiling 103 as well.

Figure 5:
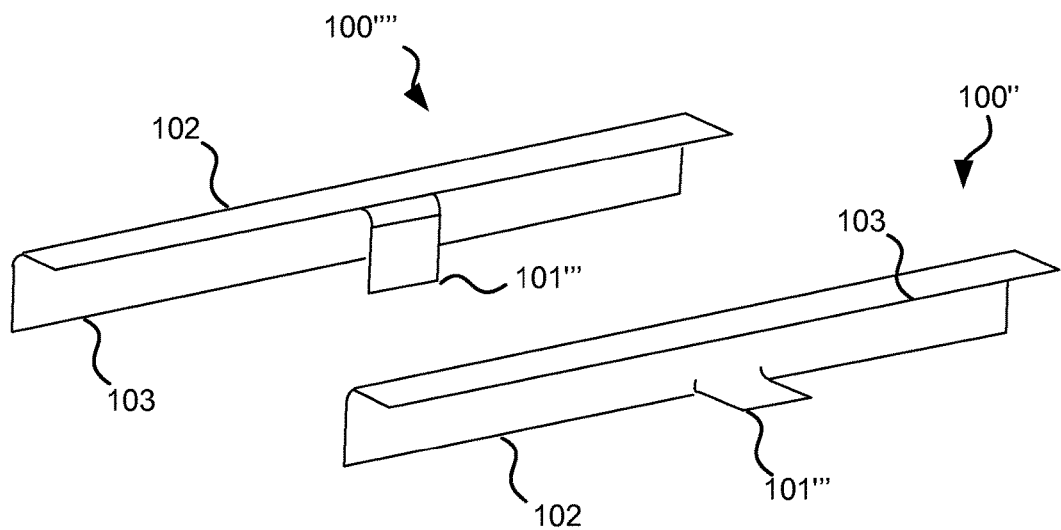
FIG. 5 illustrates a schematic representation of a modular shielding block having a single supporting element illustrated at different angels, in accordance with an embodiment.

FIG. 5 illustrates an embodiment wherein the block 100" of FIG. 3 is rotated 90 degrees in a clockwise direction. The block 100"" is resting against the PCB surface. The end of the supporting leg 101''' and the end of the ceiling 103 are resting against the PCB surface. In an/some embodiment/s, a component 104 may be positioned even between the supporting leg 101''' and the ceiling 103, which are resting against the PCB surface. For example, if the electronics include a thin and a long component, such as a wire or a bus, it may be positioned next to the ceiling 103 of the block 100"" and configured between the supporting leg 101''' and the ceiling 103 as well.

Figure 6:
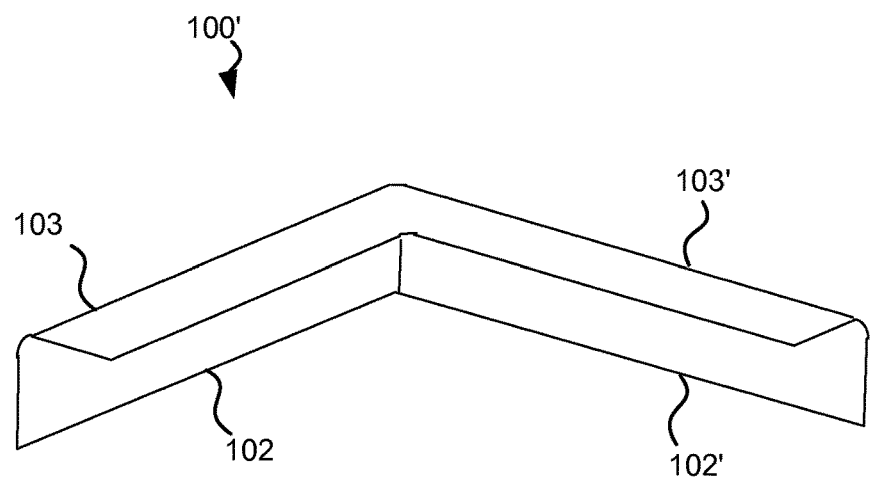
FIG. 6 illustrates a schematic representation of a modular corner shielding block illustrated at different angles according to an embodiment.
Figure 6:
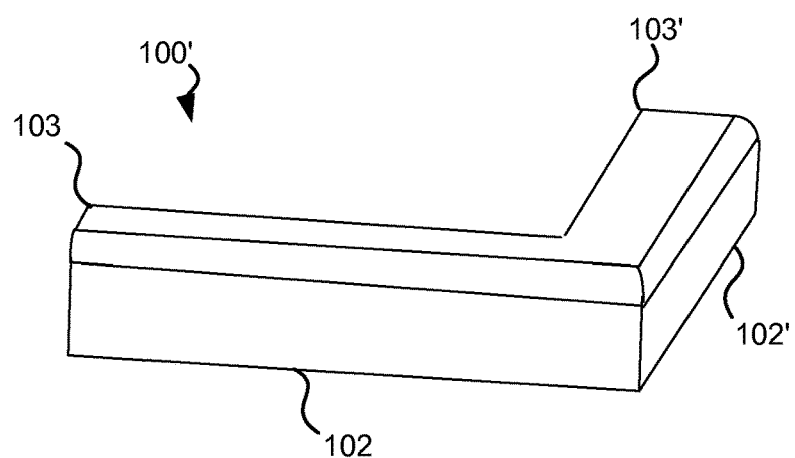

FIG. 6 illustrates a corner block 100' according to some embodiments, which is viewed at a different angle.

Figure 7:
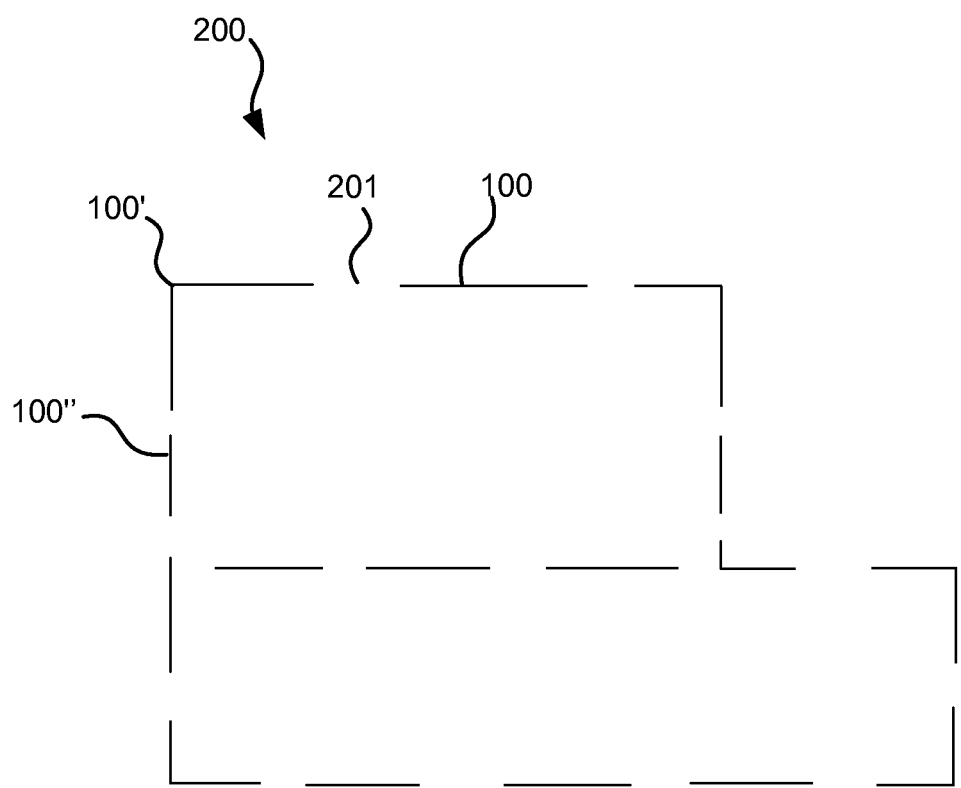
FIG. 7 illustrates a schematic representation of a completed shielding frame made of modular shielding blocks according to an embodiment.

FIG. 7 illustrates a frame 200 of RF shielding, according to one embodiment. The frame 200 is modularly constructed from the modular blocks 100.

FIG. 7 illustrates a modular frame structure. The frame 200 may include several modular blocks for example blocks 100, 100' and/or 100" (hereafter referred as "modular blocks") as shown in FIGS. 1, 2 and 3. Various different kinds of RF shielding may be constructed accordingly. There may be openings 201 between the modular blocks. For example, the size of the opening 201 may dependent on the RF frequency for which the shielding is designed. The openings 201 may cool the components 104 inside the shielding frame 200. In the embodiment of FIG. 7, the modular blocks are placed on the PCB surface. The blocks are attached to the PCB surface. The modular blocks do not take as much space on the PCB surface because components 104 may be placed right next to the walls of the modular blocks, and the frame 200 may be designed based on the space requirement of the components 104 and possibly based on the available space of the device. The frame 200 may be built from these individual modular blocks, wherein the individual blocks are placed next to each other and soldered onto PCB landings. The individual modular blocks may be attached to PCB with one or more of a plurality of methods such as soldering, gluing with conductive adhesive, etc.

According to an embodiment, modular blocks may be curvedly shaped or circular (not shown in the figures), instead of or in addition to the straight or corner shaped blocks as illustrated.

According to an embodiment, modular blocks may be of different heights (not shown in the figures). Consequently, a layered structure of the RF shielding 300 may be constructed, wherein each layer has a different height. For example, a different height may be designed on a basis of the height of a component 104, the available space of the device, etc.

Figure 8:
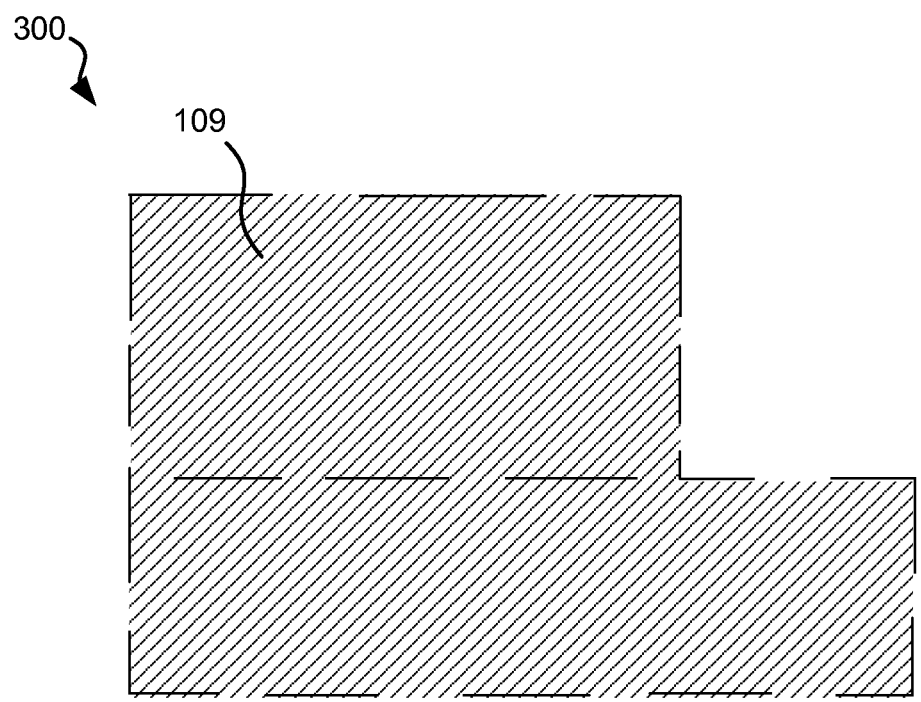
FIG. 8 illustrates a schematic representation of a roof being placed on top of a completed shielding frame according to an embodiment.

According to an embodiment, a modular RF shielding 300 in FIG. 8 may be configured to act as a heat transfer device. For example, undesired heat may be transferred from a PCB spot inside the shielding 300 to a desired spot for the heat in a certain location outside the shielding 300. The openings 201 may also be used for this purpose.

According to an embodiment, when the modular blocks are attached to the PCB surface using the supporting elements such as the supporting element 101' shown in FIG. 1, there is no need to make any holes in the PCB surface, as any kind of hole would affect negatively and reserve space on both sides of PCB. The PCB surface may remain intact, and the blocks may be simply attached to it.

FIG. 8 illustrates an embodiment of a radio frequency shielding 300.

A roof 109 is attached on top of the frame 200 to enclose the radio frequency shielding 300. According to an embodiment, copper or another conductive metal tape may be placed on top of the frame 200 to act as a roof 109. According to an embodiment, the conductive tape may be based on polymers etc. According to another embodiment, the roof 109 may be made of a single metal piece, or multiple metal pieces. The roof 109 may be attached to the ceiling 103 of each modular block of the frame 200. For example, after each modular block has been attached to the PCB surface, the roof 109 may be attached to the ceiling 103. Soldering may typically be used for attaching them.

According to an embodiment, a modular RF shielding 300 may improve freedom of design of the PCB. According to an embodiment, the RF shielding 300 may conform to the shape and/or design of the PCB. Consequently, the PCB with the shielding occupies less space within the device. According to an embodiment, a modular radio frequency shielding may benefit relatively small sized devices, such as mobile phones or wearable devices. The physical size of the PCB may be subject to a restricted space, for example because of the limited available space of the device. Consequently, a compact design of the RF shielding, the PCB and the device may be considered.

According to an embodiment, a relatively large RF shielding may be constructed from various modular blocks. The modular design may prevent the RF shielding 300 from undesired bending or folding, as compared to a single piece RF shielding. According to an embodiment, the modular RF shielding 300 may strengthen the PCB construction mechanically. Consequently, it may prevent the PCB and its components 104 from being damaged, which may be caused by a mechanical shock or impulse such as falling or overbalancing of the device.

An embodiment of the device requiring RF shielding for certain components 104 may be a mobile phone. While embodiments of the device have been discussed in the form of a smartphone, as discussed, other relatively small high frequency computing devices may be used equivalently, such as tablet computers, netbook computers, small laptop computers, personal digital assistants (PDAs), wearable devices, small touchscreen devices connected to a video game console or set-top box, or any other small computing device that has a need for RF shielding.

The term 'computer', 'computing-based device', 'apparatus' or 'mobile apparatus' is used herein to refer to any device with processing capability such that it can execute instructions. Those skilled in the art will realize that such processing capabilities are incorporated into many different devices.

Figure 9:
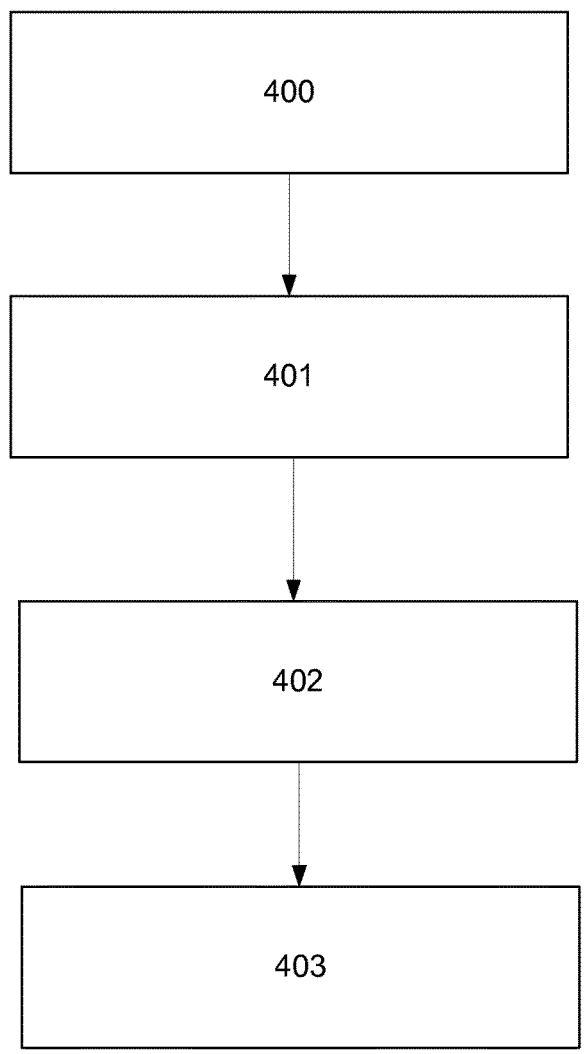
FIG. 9 illustrates a manufacturing process, in accordance with an illustrative embodiment.

An embodiment of a manufacturing process for manufacturing the modular RF shielding is illustrated in FIG. 9.

According to an embodiment, a method comprises the following steps. In step 400, an electrical component 104 is placed on the PCB. For example, electrical components 104 may be placed on solder pasted PCB. In step 401, a plurality of radio frequency shielding blocks 100 is placed on a printed circuit board. The step 401 may typically happen after the placement of electrical components 104 in the step 400. Each shielding modular block includes an electrically conductive wall 102 configured for radio frequency shielding. Furthermore, they include an electrically conductive portion of a ceiling 103, wherein the portion of the ceiling 103 is connected to the wall 102. Furthermore, they include at least one support element 101, if the shape of the modular block itself does not prevent the block from falling or overbalancing without any support elements as is the case with corner block 100' in FIG. 2, extending transversely from the wall 102 and configured to uphold the wall 102. The support element 101 is configured to rest against a portion of the PCB. Consequently, the modular block 100 may rest on the PCB surface without falling or overbalancing and without having any other attaching or supporting mechanism than the support element 101. The design of a shielding frame 200, which is made of the modular blocks, may be simple and straightforward. The wall 102 is configured so that a component 104 of the PCB can be positioned next to the wall and/or at least partly being beneath the portion of the ceiling 103. According to an embodiment, some components 104 may be next to the wall, however not directly beneath the portion of the ceiling 103. In step 402, a plurality of modular blocks are attached to the PCB to establish a RF shielding frame 200. For example, the blocks 100 may be soldered to the PCB surface. In step 403, a cover 109 is attached on top of the frame 200. The cover 109 is attached to the portion of the ceiling. A metal tape can be attached on top of the frame 200 or soldering or conductive gluing may be used to attach conductive cover. According to an embodiment, the cover may also hold mechanically its position simply through snap-in type locking as a result of its original design.

The manufacturing methods and functionalities described herein may be operated by software in machine readable form on a tangible storage medium e.g. in the form of a computer program comprising computer program code means adapted to perform all the functions and the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage medium, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any example may be combined to another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as embodiments of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought, or without extending beyond the disclosure.

The term 'comprising' is used herein to mean including the method, blocks or elements identified, but that such blocks or elements do not comprise an exclusive list and a method or apparatus may contain additional blocks or elements.

According to an embodiment, a device comprises: at least one radio frequency shielding block including: an electrically conductive wall configured to radio frequency shielding; an electrically conductive portion of a ceiling, wherein the portion of the ceiling is connected to the wall; at least one support element extending transversely from the wall and configured to uphold the wall, wherein the support element is configured to rest against a portion of a printed circuit board and a length of the support element is shorter than a length of the block; wherein the wall is configured next to an electrical component of the printed circuit board and wherein the electrical component is configured at least partly beneath the portion of the ceiling.

Alternatively or in addition to the above, the wall is further configured next to the electrical component without the electrical component resting on the support element. Alternatively or in addition to the above, the support element comprises a horizontal supporting leg. Alternatively or in addition to the above, the block comprises a single support element. Alternatively or in addition to the above, the single support element is configured substantially at the center of the block in a longitudinal direction. Alternatively or in addition to the above, the block comprises two or more support elements. Alternatively or in addition to the above, the two support elements are configured substantially at both ends of the block. Alternatively or in addition to the above, the block comprises a corner block. Alternatively or in addition to the above, the corner block includes another wall and another portion of a ceiling, wherein the other wall is configured as the support element for the wall of the corner block and vice versa. Alternatively or in addition to the above, the wall and the other wall are configured at an angle of 90 degrees. Alternatively or in addition to the above, the electrical component comprises electronics which are subject to a radio frequency disturbance. Alternatively or in addition to the above, further including a radio frequency shielding frame, which is configured from a plurality of the radio frequency shielding blocks, and the device comprises the plurality of the blocks. Alternatively or in addition to the above, further including a roof which is configured on top of the frame. Alternatively or in addition to the above, further including openings between the blocks. Alternatively or in addition to the above, a width of the openings is configured based on a wavelength of the radio frequency. Alternatively or in addition to the above, the plurality of the radio frequency shielding blocks is configured as a modular radio frequency shielding device. Alternatively or in addition to the above, the plurality of blocks includes blocks with at least two different heights for establishing layered structures. Alternatively or in addition to the above, the portion of the ceiling comprises a canopy.

According to an embodiment, a device comprises: a plurality of modular radio frequency shielding blocks, each block including: an electrically conductive wall configured to radio frequency shielding; an electrically conductive ceiling, wherein the ceiling is connected to the wall; wherein a portion of the block is configured to extent transversely from the wall and configured to uphold the wall, wherein the portion is configured to rest against a portion of a printed circuit board of the mobile device; wherein the wall is configured next to an electrical component of the printed circuit board and the electrical component is configured at least partly beneath the ceiling.

According to an embodiment, a method comprises: placing at least one electrical component on a printed circuit board; placing a plurality of radio frequency shielding blocks on the printed circuit board; each shielding block including: an electrically conductive wall configured to radio frequency shielding; an electrically conductive portion of a ceiling, wherein the portion of the ceiling is connected to the wall; at least one support element extending transversely from the wall and configured to uphold the wall, wherein the support element is configured to rest against a portion of a printed circuit board and a length of the support element is shorter than a length of the block; wherein the wall is configured next to an electrical component of the printed circuit board and wherein the electrical component is configured at least partly beneath the portion of the ceiling; attaching the plurality of blocks to the printed circuit board to establish a frame; attaching a cover on top of the frame, wherein the cover is attached to the portion of the ceiling.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device, comprising:
   at least one radio frequency shielding block comprising:
      an electrically conductive wall configured for radio frequency shielding;
      an electrically conductive portion of a ceiling, wherein the portion of the ceiling is integrated with the electrically conductive wall and extends transversely from the electrically conductive wall along a direction;
      at least two feet extending transversely from the electrically conductive wall in the direction the electrically conductive portion of the ceiling is transversely extending, the at least two feet configured to uphold the electrically conductive wall and rest against a portion of a printed circuit board in parallel, relative to the direction the electrically conductive portion of the ceiling is transversely extending, to an electronic component disposed on the printed circuit board and positioned underneath at least a portion of the electrically conductive portion of the ceiling,
      wherein the at least two feet extending from the electrically conductive wall in parallel with the electrically conductive portion of the ceiling and being configured to uphold the electrically conductive wall, and
      wherein the at least two feet and the electrically conductive wall surround the electrical component on the printed circuit board along three sides of the electrical component.

2. The device of claim 1, wherein the wall is further configured next to the electrical component without the electrical component resting on the at least two feet.

3. The device of claim 1, further comprising a cover attached to the electrically conductive portion of the ceiling.

4. The device of claim 3, wherein an electrical component is situated against the electrically conductive wall between the at least two feet.

5. The device of claim 4, wherein the electrically conductive wall includes rounded edges where the at least two feet meet the electrically conductive wall.

6. The device of claim 5, wherein the rounded edges are located at opposite ends of the electrically conductive wall.

7. The device of claim 5, wherein rounded edges curve away from the electrically conductive wall in the direction the ceiling is transversely extending.

8. The device of claim 1, wherein the block comprises a corner block.

9. The device of claim 8, wherein the corner block includes another wall and another portion of a ceiling.

10. The device of claim 9, wherein the wall and said another wall are configured at an angle of 90 degrees.

11. The device of claim 1, wherein the electrical component comprises electrical circuitry that is subject to a radio frequency disturbance.

12. The device of claim 1, further including a radio frequency shielding frame, which is configured from a plurality of blocks comprising the at least one radio frequency shielding block.

13. The device of claim 12, further including a roof which is configured on top of the frame.

14. The device of claim 13, further including openings between the blocks.

15. The device of claim 14, wherein a width of the openings is configured based on a wavelength of the radio frequency.

16. The device of claim 15, wherein the plurality of blocks is configured as a modular radio frequency shielding device.

17. The device of claim 12, wherein the plurality of blocks includes blocks with at least two different heights for establishing layered structures.

18. The device of claim 1, wherein the portion of the ceiling comprises a canopy.

19. A device, comprising:
   a modular radio frequency shielding block comprising:
      an electrically conductive wall configured for radio frequency shielding;
      an electrically conductive ceiling, wherein the ceiling is integrated with the electrically conductive wall and extends transversely from the electrically conductive wall along a direction; and
      two feet extending transversely from the electrically conductive wall in the direction that the electrically conductive ceiling transversely extends, the two feet configured to uphold the electrically conductive wall and rest against a portion of a printed circuit board in parallel, relative to the direction the electrically conductive portion of the ceiling is transversely extending, to an electrical component disposed on the printed circuit board and positioned underneath at least a portion of the electrically conductive ceiling,
      wherein the two feet and the electrically conductive wall surround the electrical component on the printed circuit board along three sides of the electrical component, and
      wherein the electrically conductive wall is positioned next to the electrical component of the printed circuit board.

20. A method comprising:
   placing at least one electrical component on a printed circuit board;
   placing a plurality of radio frequency shielding blocks on the printed circuit board;
   wherein at least one of the shielding blocks comprise:
      an electrically conductive wall configured for radio frequency shielding;

an electrically conductive portion of a ceiling, wherein the portion of the ceiling is connected to the wall and extends transversely from the electrically conductive wall along a direction;

two feet that transversely extend from the wall in parallel with the ceiling that are configured to uphold the wall;

attaching the plurality of blocks to the printed circuit board to establish a frame such that the two feet and the electrically conductive wall surround an electrical component on the printed circuit board along three sides of the electrical component; and attaching a cover on top of the frame, wherein the cover is attached to the portion of the ceiling.

* * * * *